US006718514B2

(12) United States Patent
Kang

(10) Patent No.: US 6,718,514 B2
(45) Date of Patent: Apr. 6, 2004

(54) PARITY CHECKING DEVICE AND METHOD IN DATA COMMUNICATION SYSTEM

(75) Inventor: Myung-Goo Kang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 403 days.

(21) Appl. No.: 09/751,509

(22) Filed: Dec. 29, 2000

(65) Prior Publication Data

US 2001/0021989 A1 Sep. 13, 2001

(30) Foreign Application Priority Data

Dec. 29, 1999 (KR) ................................. P1999-65241

(51) Int. Cl.[7] ............................................... G06F 11/00
(52) U.S. Cl. .................................... 714/800; 712/10
(58) Field of Search ............................ 714/800, 807, 714/803; 371/49; 712/10; 364/715; 708/670, 585, 505

(56) References Cited

U.S. PATENT DOCUMENTS

| 4,462,102 | A | * | 7/1984 | Povlick | 371/49 |
|---|---|---|---|---|---|
| 4,486,848 | A | * | 12/1984 | Kaminski | 364/715 |
| 5,978,957 | A | * | 11/1999 | Haller et al. | 714/803 |
| 6,094,668 | A | * | 7/2000 | Oberman | 708/505 |
| 6,108,763 | A | * | 8/2000 | Grondalski | 712/10 |
| 6,301,600 | B1 | * | 10/2001 | Petro et al. | 708/670 |

* cited by examiner

Primary Examiner—Albert Decady
Assistant Examiner—Dipakkumar Gandhi
(74) Attorney, Agent, or Firm—Dilworth & Barrese, LLP

(57) ABSTRACT

There is provided parity checking device and method in a data communication system. In the parity checking device, a controller determines loop occurring times according to the length of the data and the number of bits to be shifted according to the data or XOR operation results and determines whether the data has an error based on a final XOR operation result. A first register and a second register store the data or the XOR operation results under the control of the controller. A shifter receives the output of the first register and shifts the received bits by the shift bit number received from the controller. An operation unit receives the outputs of the shifter and the second register, performs an XOR operation between the received data, and outputs an XOR operation result under the control of the controller.

11 Claims, 4 Drawing Sheets

PARITY CHECKING DEVICE AND METHOD IN DATA COMMUNICATION SYSTEM

PRIORITY

This application claims priority to an application entitled "Parity Checking Device and Method in Data Communication System" filed in the Korean Industrial Property Office on Dec. 29, 1999 and assigned Serial No. 99-65241, the contents of which are hereby incorporated by reference.

BACKGROUND OF THE INVENTION

1. Field of the Invention

The present invention relates generally to an error checking device and method in a data communication system, and in particular, to an error checking device and method using parity checking.

2. Description of the Related Art

A data communication system exchanges data between a transmitter and a receiver. Errors may occur in the exchanged data according to the communication environment between the transmitter and the receiver. Hence, the data communication system needs to check for possible generated errors in the received data and correct them. A popular error checking method is parity checking.

According to a conventional error checking method utilizing parity checking, after data is shifted on a bit basis, it is determined whether a carry (e.g., value "1") has been generated after the bit shift, and the number of carries are counted. If all the bits of the data are completely shifted, the resulting count value is subjected to modulo-2 addition and it is checked whether the remainder of the modulo-2 addition is "0" or "1" to thereby determine whether the data has errors. Consequently, the conventional parity check method is the process of determining whether data has errors depending on whether the data has an odd or even number of 1s.

FIG. 1 is a flowchart illustrating the conventional parity check method in a data communication system.

Referring to FIG. 1, a loop count and a carry count are set to 0s in step 110 and data is shifted by one bit in step 120. It is determined whether a carry has been generated after the shift in step 130. Upon generation of a carry, the carry count is increased by 1 in step 140. If the carry is not generated in step 130 or the carry count is increased in step 140, the loop count is increased by 1 in step 150. In step 160, it is determined whether all the bits of the data have been shifted completely by comparing the loop count with the length of the data. If the loop count is greater than or equal to the data length, it is determined that all the bits of the data have been shifted completely.

If it is determined that all the bits of the data are not shifted in step 160, steps 120 to 160 are repeated. On the other hand, upon completion of the bit shifts in step 160, the carry count is modulo-2 added in step 170. It is determined whether the data has an error based on the remainder of the modulo-2 addition in step 180. Since the carry count is divided by 2, the remainder is 0 or 1. For example, if the remainder is 1, it may be considered that an error has occurred and if it is 0, it may be considered that the data has no errors.

In the foregoing conventional parity check method, a decision is made as to whether a carry has been generated in a loop at every bit shift of the data. Thus, time required for error check increases in proportion to the number of the bits of the data. For example, if the data has $2^n$ bits, the loop must occur $2^n$ times.

SUMMARY OF THE INVENTION

It is, therefore, an object of the present invention to provide a parity checking device and method in which a parity check is performed on data for a reduced time in a data communication system.

It is another object of the present invention to provide a parity checking device and method in which a parity check is performed on $2^n$-bit data by repeating a loop (n−1) times (i.e., n loop occurrences) in a data communication system.

It is a further object of the present invention to provide a parity checking device and method utilizing XOR operations in a data communication system.

It is still another object of the present invention to provide a parity checking device and method in which a parity check is performed on data through iterative XOR operations between the upper half bit sequence and lower half bit sequence of the data, and the presence or absence of errors is determined based on the final XOR operation result.

To achieve the above and other objects, there is provided a parity checking device and method in a data communication system. In the parity checking device, a controller determines loop occurring times according to the length of the data and the number of bits to be shifted according to the data or XOR operation results and determines whether the data has an error based on a final XOR operation result. A first register and a second register store the data or the XOR operation results under the control of the controller. A shifter receives the output of the first register and shifts the received bits by the shift bit number received from the controller. An operation unit receives the outputs of the shifter and the second register, performs an XOR operation between the received data from the shifter and second register, and outputs an XOR operation result under the control of the controller.

It is determined whether the data has an error based on a final XOR operation result after as many XOR operations as the loop occurring times are performed.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

Figure 1:
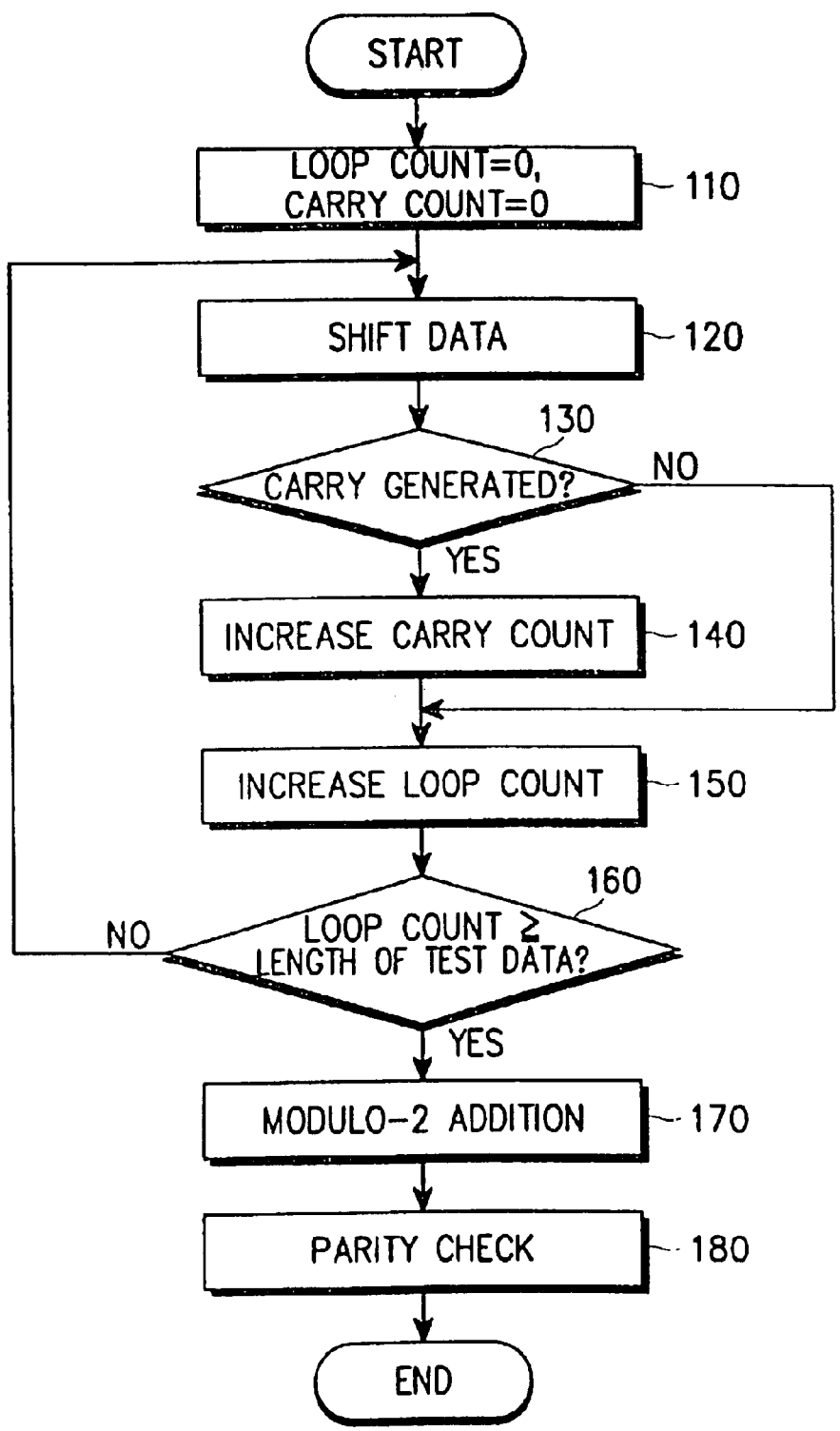
FIG. 1 is a flowchart illustrating a control operation for a parity check method in a conventional data communication system.

A preferred embodiment of the present invention will be described hereinbelow with reference to the accompanying drawings. In the following description, well-known functions or constructions are not described in detail since they would obscure the invention in unnecessary detail.

In accordance with the present invention, addition and modulo-2 addition as performed in the conventional parity check method are replaced with an XOR operation in order to reduce the time required for parity checking in a data communication system. The XOR operation is performed between the upper half bit sequence and lower half bit sequence of data of length $M=2^n$. The upper half bit sequence and lower half bit sequence of the XOR operation result are in turn subjected to an XOR operation and then the resulting value is again XOR-operated. Therefore, n ($=\log_2^M$) XOR operations occur. Based on the final XOR operation result, it is determined whether an error has been generated in the data.

For example, let data ($M=2^n=8$, n=3) be '1001 1110'. The data '1001 1110' is stored in first and second registers. The data stored in the first register is shifted by half of the length of the data, $2^{n-1}=4$ bits. Then, the bits stored in the first register is XOR-operated with the bits stored in the second register. The XOR operation result '0111' is stored in both the first and second registers. If the shift occurs in the right direction and the length of each register is equal to the data length, the upper 4 bits of each register other than the XOR operation result '0111' are neglected.

The upper half bit sequence '01' of '0111' stored in both the first and second registers is XOR-operated with the lower half bit sequence '11'. For the XOR operation, the bits '0111' stored in the first register are shifted by half of the bits, $2^{n-2}=2$ bits. Then, the bits stored in the first register are XOR-operated with the bits stored in the second register. The XOR operation result '10' is stored in both the first and second registers. Here, the upper 6 bits of each register other than '10' are neglected.

The upper bit '1' of '10' stored in both the first and second registers is XOR-operated with the lower bit '0'. The upper 7 bits of each register other than the XOR operation result, that is, the LSB (Least Significant Bit) '1' are neglected. If the LSB is 1, it implies that the data has an odd number of is and if the LSB is 0, it implies that the data has an even number of 1s.

As noted from the above procedure, parity check is performed through n (=3) XOR operations for the data with $M=2^n=8$ and the length of the data determines the number of XOR operations (n=$\log_2^M$) in the embodiment of the present invention.

It makes no difference whether the data is shifted to the left or to the right in the embodiment of the present invention. For example, when bit masking is performed on the value of a register (e.g., AND operation between the value of the first register and '1'), the LSB is the result bit in the case of shift to the right whereas the MSB (most significant bit) is the result bit in the case of shift to the left.

Figure 3:
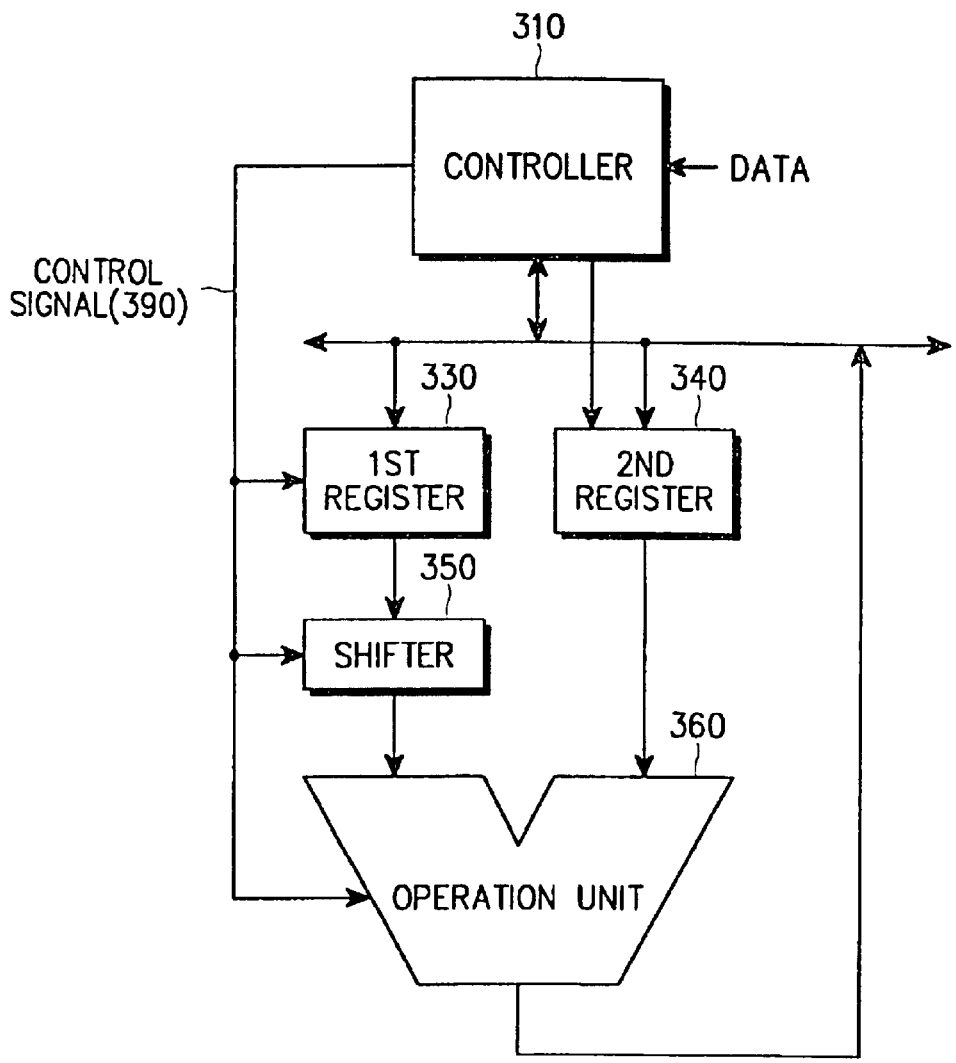
FIG. 3 is a block diagram of a parity checking device in the data communication system according to the embodiment of the present invention.

FIG. 3 is a block diagram of a parity checking device to perform the above parity check according to the embodiment of the present invention.

Referring to FIG. 3, first and second registers 330 and 340 store the bits of data when they are initialized and then the results of iterative XOR operations under the control of a controller 310 according to the embodiment of the present invention. A shifter 350 shifts the data or the XOR operation results received from one of the first and second registers 330 and 340 by predetermined numbers of bits. Specifically, the shifter 350 shifts the data or the XOR operation results received from the first register 330 by half of the length of the data or half of the length of the previous XOR operation results. An operation unit 360 performs an XOR operation between bits received from the shifter 350 and bits received from the second register 340. An ALU (Arithmetic Logic Unit) may be used as the operation unit 360. The controller 310 receives the data, checks the length ($2^n$ bits) of the data, and determines loop occurring times, n. If XOR operations are performed n times, the controller 310 performs a parity check according to the MSB or LSB of bits stored in the first and second registers 330 and 340. The controller 310 also outputs a control signal 390 to control the operations of the first and second registers 330 and 340, the shifter 350, and the operation unit 360.

The parity checking device shown in FIG. 3 can be arranged inside a DSP (Digital Signal Processor) chip. Here, an algorithm needed to implement the parity check is stored in an internal memory of the DSP and the controller 310 controls the parity check operation by the algorithm.

The parity checking procedure according to the embodiment of the present invention will be described referring to FIG. 2. The following description is conducted with the appreciation that data ($2_n=8$, n=3) is '1001 1110', by way of example.

The controller 310 receives the data, checks its length, and determines how many times a loop will occur. The loop occurring times is n. Therefore, a loop occurs three times in this example. The controller 310 controls the loop repetition, starting from a loop count=1. The controller 310 stores the data in the first and second registers 330 and 340, as indicated by reference numerals 213 and 215 and the first and second registers 330 and 340 output their stored data under the control of the controller 310. The shifter 350 receives the data from the first register 330 and shifts the data by half of the data length, $2^{n-1}$ bits (4 bits) as controlled by the controller 310. Reference numeral 219 in FIG. 2 indicates the shift of the data '1001 1110' to the right by 4 bits. That is, the shifter 350 outputs '0000 1001'. The shifter 350 may be a Barrel shifter which can shift a plurality of bits at the same time in a single cycle. The operation unit 360 performs an XOR operation between the bits received from the shifter 350 and the bits received from the second register 340 bit by bit under the control of the controller 310, as indicated by reference numeral 217. As noted from the XOR operation result '1001 0111', if two bits to be XOR-operated are 1s, the XOR operation result equals the result from addition of the 1s and modulo-2 addition of the sum. The operation unit 360 outputs the XOR operation result, '1001 0111' to the first and second registers 330 and 340, as indicated by reference numerals 223 and 225.

As described above, if the loop count is 1, the data is divided into the upper half bits and the lower half bits and they are XOR-operated. The upper 4 bits '1001' of the bits stored in the first and second registers 330 and 340 are discarded, as indicated by reference numeral 221. The other bits '0111' will be termed effective bits hereinafter.

If the XOR operation for loop count=1 is completed, the controller 310 increases the loop count by 1. Now, a control operation for loop count 2 is initiated.

The first and second registers 330 and 340 output their stored bits '1001 0111' under the control of the controller 310. The shifter 350 receives the bits from the first register 330 and shifts them by a fourth of the data length, $2^{n-2}$ bits (2 bits). A fourth of the data length equals half of the effective bits '0111'. The controller 310 feeds the number of bits to be shifted, $2^{n-2}$ to the shifter 350. Reference numeral 229 indicates the shift of the bits of the first register 330, '1001 0111' to the right by 2 bits. Thus, the shifter 350 outputs '0010 0101'. The operation unit 360 performs an XOR operation between the bits '0010 0101' received from the shifter 350 and the bits '1001 0111' received from the second register 340 bit by bit, as indicated by reference numeral 227. As noted from the XOR operation result '1011 0010', if two bits to be XOR-operated are 1s, the XOR operation result equals the result from addition of the is and modulo-2 addition of the sum. The operation unit 360 outputs the XOR operation result, '1011 0010' to the first and second registers 330 and 340, as indicated by reference numerals 233 and 235.

As described above, if the loop count is 2, the four effective bits are divided into the upper two bits and the lower two bits and they are XOR-operated. The upper 6 bits '101100' of the bits stored in each registers are discarded, as indicated by reference numeral 231. The other bits '10' are effective bits.

If the XOR operation for loop count=2 is completed, the controller 310 increases the loop count by 1 and thus a control operation for the loop count=3 is initiated.

The first and second registers 330 and 340 output their stored bits '1011 0010' under the control of the controller 310. The shifter 350 receives the bits from the first register 330 and shifts them by an eighth of the data length, $2^{n-3}$ bits (1 bit). An eighth of the data length equals half of the effective bits '10'. The controller 310 feeds the number of bits to be shifted, $2^{n-3}$ to the shifter 350. The operation unit 360 performs an XOR operation between the bits '0101 1001' received from the shifter 350 with the bits '1011 0010' received from the second register 340 bit by bit, as indicated by reference numeral 237. The operation unit 360 outputs the XOR operation result '1110 1011' to the first register 330, as indicated by reference numeral 241.

The LSB '1' in the bits '1110 1011' stored in the first register 330 is a final result. To output the final result, the operation unit 360 performs an AND operation between the bits '1110 1011' stored in the first register 330 and bits with an LSB=1 '0000 0001' as indicated by reference numeral 243. As a result, reference numeral 249 indicates the bits '0000 0001'. Based on the final result '1' received from the operation unit 360 at reference numeral 247, the controller 310 determines whether the data has errors, that is, performs a parity check on the data.

Figure 4:
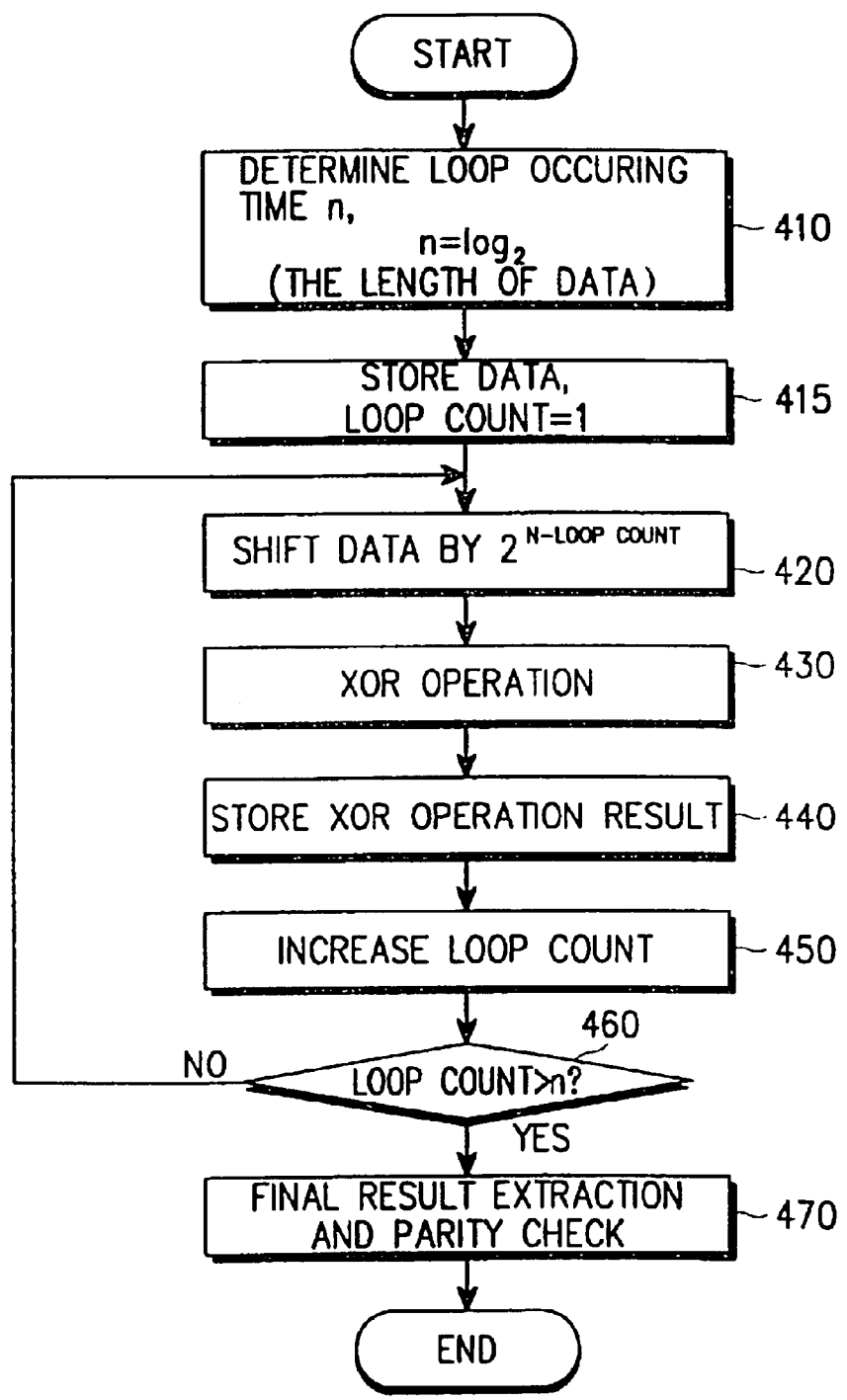
FIG. 4 is a flowchart illustrating a control operation for a parity check method in the data communication system according to the embodiment of the present invention.

FIG. 4 is a flowchart illustrating the parity check operation in the data communication system according to the embodiment of the present invention.

Figure 2:
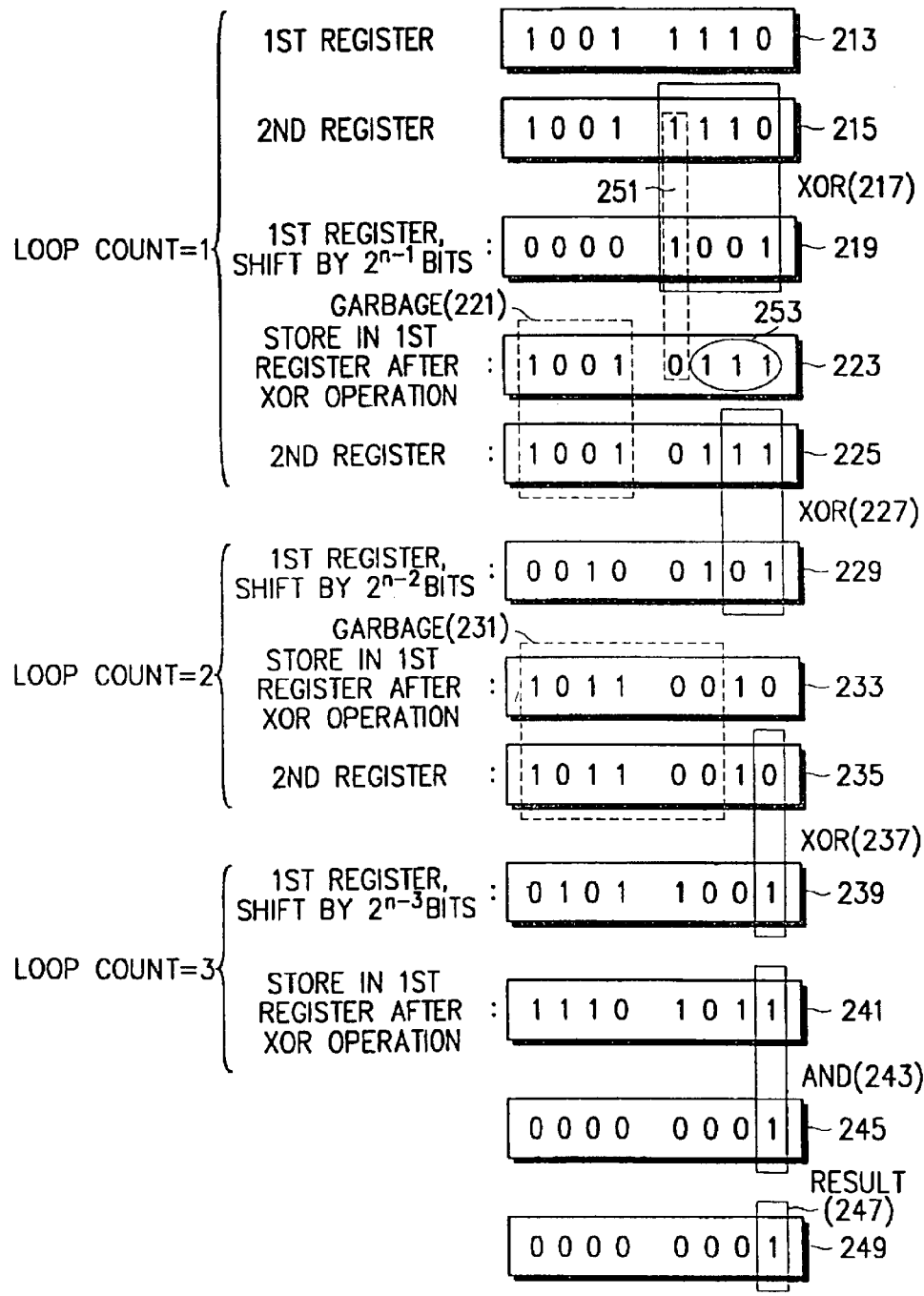
FIG. 2 illustrates a parity checking procedure in a data communication system according to an embodiment of the present invention.

Referring to FIGS. 2 and 4, upon receipt of data, the controller 310 checks the length $2^n$ of the data and determines loop occurring times n in step 410. The loop occurring times n is expressed as log 2 (length of data) and determines the number of XOR operations for parity checking. The controller 310 stores the data in both the first and second registers 330 and 340 in step 415. Then, the controller 310 sets a loop count to an initial value '1'.

In step 420, the controller 310 shifts the data stored in the first register 330 by a predetermined number of bits. Specifically, the controller 310 controls the first register 330 to output the stored data to the shifter 350 and feeds the number of bits to be shifted to the shifter 350. The number of shift bits is calculated in Equation 1 by $$\text{shift bit number} = 2^{n-loop\ count}, n = \log_2(length\ of\ [test]\ data) \quad \text{Equation 1}$$

where the shift bit number is the number of bits to be shifted in the data received at the shifter 350 from a corresponding register. As defined before, for $2^n$-bit data, $\log_2^{(length\ of\ data)}$ is n. The loop count is set to an initial value 1 in step 415.

As noted from Eq. 1, when the loop count is 1, the shift bit number equals half of the length of the data. If the loop count is greater than 1, the shift bit number equals half the length of effective bits in the previous XOR operation result.

The shifter 350 shifts the data received from the first register 330 by the shift bit number received from the controller 310.

Upon completion of the shift, the controller 310 controls the second register 340 to output its stored data in step 430. If the loop count is 1, the second register 340 outputs the data. On the other hand, if the loop count is greater than 1, the second register 340 outputs an XOR operation result.

In step 430, the controller 310 controls the outputs of the shifter 350 and the second register 340 to be XOR-operated. The operation unit 360 performs an XOR operation between the bits received from the shifter 350 and the bits received from the second register 340 bit by bit. In step 440, the XOR operation result is stored in the first and second registers 330 and 340 under the control of the controller 310.

Then, the controller 310 increases the loop count by 1 in step 450 and determines whether the loop has occurred n times by comparing the loop count with n in step 460. If the loop count is greater than n, the controller 310 considers that the loop has occurred n times and proceeds to step 470. If the loop count is less than or equal to n, the controller 310 considers that the loop is to be repeated and returns to step 420. Loop repetition refers to re-implementation of steps 420 to 460.

In step 470, the controller 310 receives a final result from the first register 330 in step 440 and performs a parity check. For example, if the final result is '1', the controller 310 determines that the data has an error, and if it is '0', the controller 310 determines that the data has no errors.

The final result is the MSB or the LSB of the bits stored in the first register 330 depending on the shift direction. For example, if the shifter 350 shifts to the light, the LSB is the final result, and if the shifter 350 shifts to the left, the MSB is the final result.

In accordance with the present invention as described above, an XOR operation is performed between the upper half bit sequence of data and the lower half bit sequence and the XOR operation is performed again between the upper half bit sequence and lower half bit sequence of the primary XOR operation result. In this manner, XOR operations occur n times for $2^n$-bit data. That is, a parity check is performed on the $2^n$-bit data by repeating a loop (n-1) times. Consequently, time required for parity check is reduced.

While the invention has been shown and described with reference to a certain preferred embodiment thereof, it will be understood by those skilled in the art that various changes in form and detail may be made therein without departing from the spirit and scope of the invention as defined by the appended claims.

What is claimed is:

1. A parity checking device for receiving data and checking errors in the data in a data communication system, comprising:

a controller for determining loop occurring times according to the length of the data and the number of bits to be shifted according to the data or XOR operation results and determining whether the data has an error based on a final XOR operation result;

a first register and a second register for temporarily storing the data or the XOR operation results under the control of the controller;

a shifter for receiving the output of the first register and shifting the received bits by the determined number of bits received from the controller; and an operation unit for receiving the outputs of the shifter and the second register, performing an XOR operation between the received data from the shifter and the second register, and outputting an XOR operation result under the control of the controller, wherein said controller is connected to said first register, said second register, said shifter, and said operation unit for providing a control signal.

2. The parity checking device of claim 1, wherein the controller sets the loop occurring times to n if the length of the data is expressed as $2^n$.

3. The parity checking device of claim 2, wherein the controller sets the shift bit number to half of the length of the data for the first loop occurrence and to half of the length of the previous XOR operation result for each of the other loop occurrences.

4. The parity checking device of claim 2, wherein if the shifter shifts the data to the left, the controller designates the MSB of data stored in the first register as the final result when the last loop is completed.

5. The parity checking device of claim 2, wherein if the shifter shifts the data to the right, the controller designates the LSB of data stored in the first register as the final result when the last loop is completed.

6. A parity checking method for receiving data and checking errors in the data in a data communication system, comprising the steps of:

determining loop occurring times according to the length of the data;

storing the data in first and second registers;

determining shift bit number and shifting the data stored in the first register by the shift bit number;

performing an XOR operation between the shifted data and the data stored in the second register on a bit by bit and outputting the XOR operation result to the first and second registers; and designating a bit of bits of a final XOR operation result as a final result when the loop occurs the loop occurring times and determining whether the data has an error based on the final result, wherein said steps of determining, storing, shifting and performing an XOR operation are controlled by a control signal.

7. The parity checking method of claim 6, wherein the loop occurring times are set to n if the length of the data is expressed as $2^n$.

8. The parity checking method of claim 6, wherein the shift bit number is set to half of the length of the data for the first loop occurrence and to half of the length of the previous XOR operation result for each of the other loop occurrences.

9. The parity checking method of claim 6, wherein the shift bit number is $2^{(n-\text{loop count})}$ when the length of the data is expressed as $2^n$ bits.

10. The parity checking method of claim 6, wherein if data is shifted to the left, the MSB of the final XOR operation result is designated as the final result.

11. The parity checking method of claim 6, wherein if data is shifted to the right, the LSB of the final XOR operation result is designated as the final result.

* * * * *